US006351187B1

United States Patent
Lu

(12) United States Patent
(10) Patent No.: US 6,351,187 B1
(45) Date of Patent: Feb. 26, 2002

(54) STRUCTURE OF OPERATIONAL AMPLIFIER

(75) Inventor: Kevin Lu, Taipei Hsien (TW)

(73) Assignee: Micon Design Technology Co., LTD (TW)

( * ) Notice: Subject to any disclaimer, the term of this patent is extended or adjusted under 35 U.S.C. 154(b) by 0 days.

(21) Appl. No.: 09/594,562

(22) Filed: Jun. 15, 2000

(51) Int. Cl.[7] .............................. H03F 3/45; H03F 3/26
(52) U.S. Cl. ...................................... 330/255; 330/264
(58) Field of Search ................................ 330/252, 253, 330/255, 261, 264

(56) References Cited

U.S. PATENT DOCUMENTS

| | | | | |
|---|---|---|---|---|
| 5,049,833 A | * | 9/1991 | Miller | 330/253 |
| 5,818,295 A | * | 10/1998 | Chimura et al. | 330/253 X |
| 6,018,267 A | * | 1/2000 | Tran et al. | 330/253 |
| 6,057,734 A | * | 5/2000 | Xu | 330/261 X |

* cited by examiner

Primary Examiner—Steven J. Mottola
(74) Attorney, Agent, or Firm—Donald C. CAsey, Esq.

(57) ABSTRACT

An operational amplifier including a differential amplifier circuit, and a reverse output buffer. The reverse output buffer has a first forward switch, a second forward switch, a first reverse switch, and a second reverse switch. The first forward switch and the first reverse switch and the second forward switch are connected in series between a reference voltage source and a grounding terminal. The second forward switch being connected between the output terminal of the operational amplifier and the grounding terminal. The second reverse switch and the second forward switch are electrically connected by a bias voltage provided from a bias voltage input terminal connected thereto, so that when the second bias voltage input terminal is at low potential and the first bias voltage is at high potential, the second reverse switch is on, and the second forward switch is off. The operational amplifier will then function normally. When the second bias voltage input terminal is at high potential and the first bias voltage input terminal is at low potential, the second reverse switch is off, and the second forward switch is on. This causes the operational amplifier to consume no electricity, and the output terminal to provide a stable low voltage output.

1 Claim, 2 Drawing Sheets

STRUCTURE OF OPERATIONAL AMPLIFIER

BACKGROUND OF THE INVENTION

The present invention related to operational amplifiers, and more particularly to an improved amplifier structure which consumes no electric current and provides a stable output when not working.

Following rapid development of integrated circuit technology, advanced ICs, such as micro-controllers, digital-to-analog converters, memory devices, and etc., are made having a minimized dimension with sophisticated operation capability. Operational amplifiers are used in a variety of IC chips. FIG. 1 illustrates a conventional operational amplifier. This amplifier structure is composed of CMOS (complementary metal-oxide semiconductor) comprising a differential amplifier 10, a reverse output buffer 20, a non-inverting terminal IP, an inverting terminal IN, a bias voltage input terminal AVB, and an output terminal OI. The differential amplifier 10 is composed of semiconductor switches M1~M5, and is connected to the non-inverting terminal IP and the inverting terminal IN. The reverse output buffer 20 is comprised of two semiconductor switches, namely, the reverse switch M6 and the forward switch M7 connected between a reference voltage and a grounding terminal GND. The output terminal O1 is connected between the semiconductor switches M6 and M7 of the reverse output buffer 20. An input bias voltage signal is provided through the bias voltage input buffer 20 to electrically connect the forward switch M7, so as to achieve proportional output. This structure of this operational amplifier is commonly used in mobile electronic apparatus such as mobile telephones, notebook computers, and personal digital assistant. However, this amplifier structure is not satisfactory because it consumes to much electric current when not working.

SUMMARY OF THE INVENTION

It is the main object of the present invention to provide an operational amplifier, which consumes no power AND provides a stable output signal through its output terminal when it is not working. The reverse output buffer according to the present invention comprises a second reverse switch and a second forward switch. The second reverse switch is connected is connected in series between the first reverse switch and the reference voltage. The second forward switch is connected is connected between the output terminal and the grounding terminal GND. A bias voltage provided from a second bias voltage input terminal of the operational amplifier electrically connects the second reverse switch and the second forward switch. When the second bias voltage input terminal is at low potential and the first bias voltage input terminal is at high potential, the second reverse is on, and the second forward switch is off, thereby causing the operational amplifier to function normally. When the s second bias voltage input terminal is at high potential and first bias voltage input terminal is at low potential, the second reverse switch is off, and the second forward switch is on, thereby causing the operation amplifier to consume no electricity, and the output terminal to provide a stable low voltage output.

DETAIL DESCRIPTION OF THE PREFERRED EMBODIMENT

Figure 1:
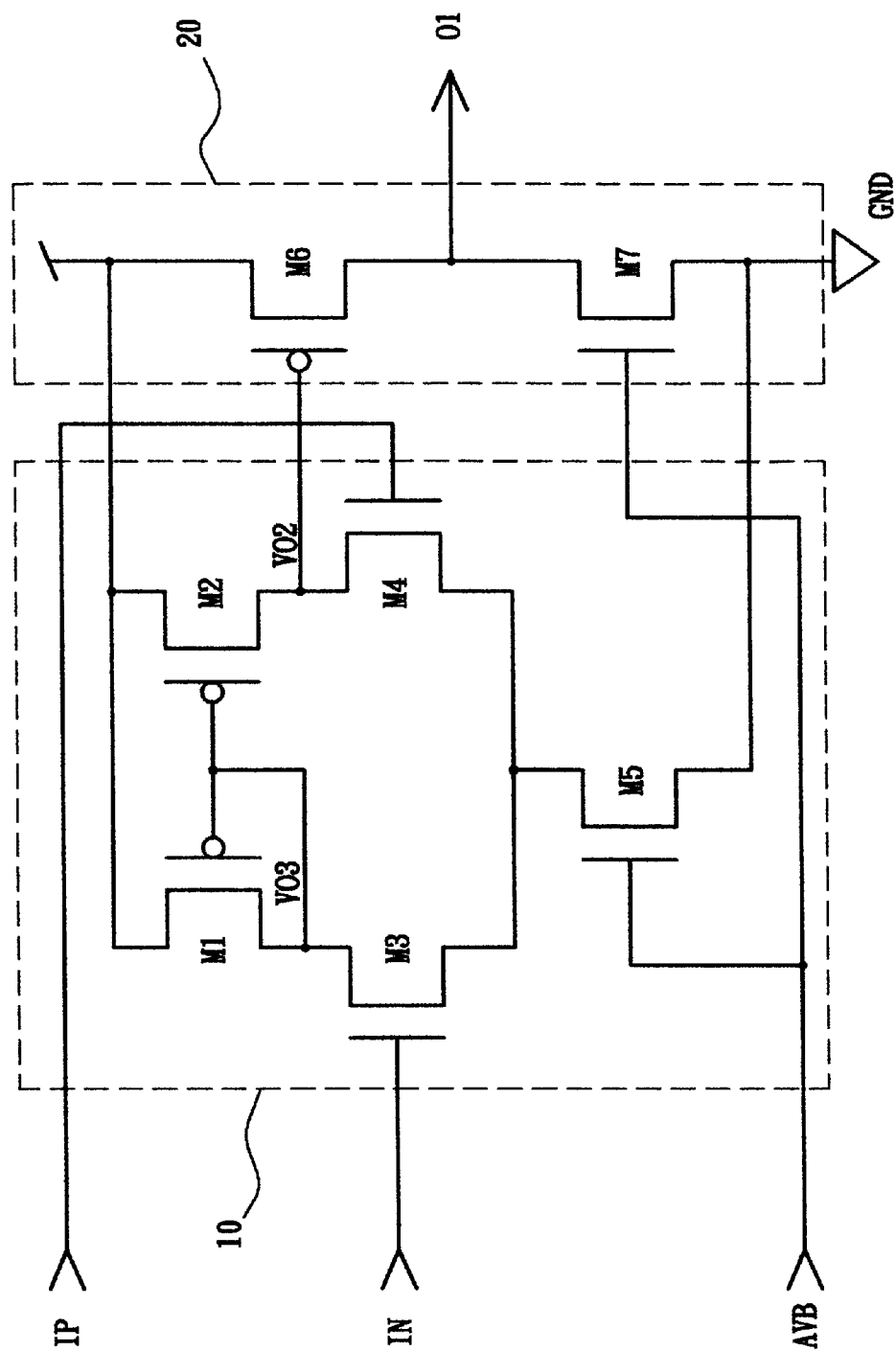
FIG. 1 is a circuit diagram of an operational amplifier according to the prior art.
Figure 2:
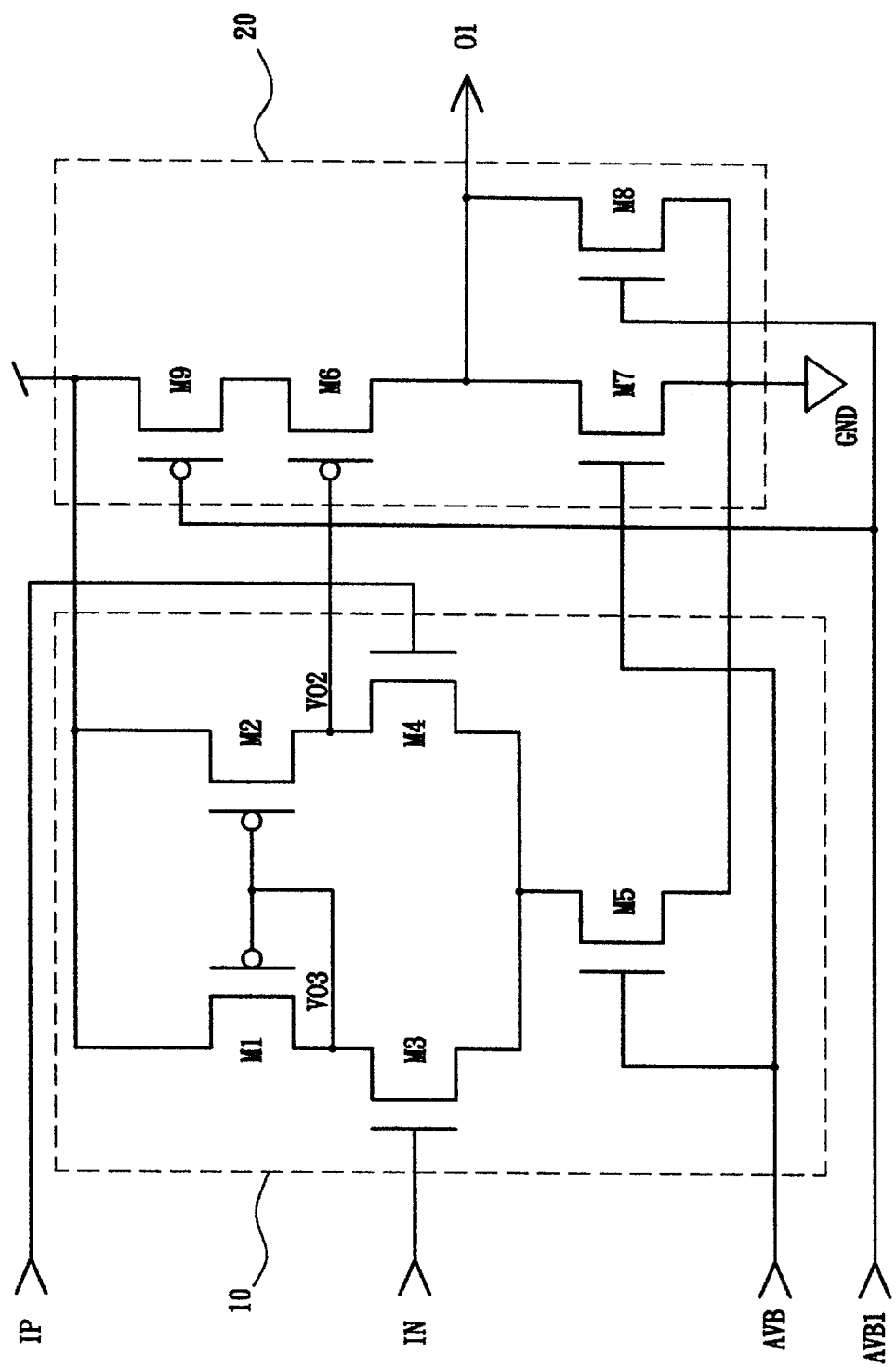
FIG. 2 is a circuit diagram of an operational amplifier according to the present invention.

Referring to FIG. 2, an operational amplifier in accordance with the present invention is comprise of a differential amplifier circuit 10, a reverse output buffer 20, a non-inverting terminal IP, an inverting a first bias voltage input terminal IN, a first bias voltage input terminal AVB, a second bias voltage input terminal AVB1, and an output terminal 01. The differential amplifier 10 is composed of semiconductor switches M1~M5, and is connected to the non-inverting terminal IP, the inverting terminal IN and the first bias voltage input terminal AVB. The reverse output buffer 20 comprises a first reverse switch M6, a first forward switch M87, a second reverse switch M9, and a second forward switch M8. The first forward switch M87, the first reverse switch M6 and the second reverse switch M9 are connected in series between a grounding terminal GND and a reference voltage. The output terminal 01 is connected between the semiconductor switches M6 and M7 of the reverse buffer 20. The first bias voltage input terminal AVB provides a bias voltage to the differential amplifier 10 and to the reverse output buffer 20 which are electrically connected to the first forward switch M7 of the reverse output buffer 20. The second bias voltage input terminal AVB1 provides a bias voltage to electrically connect the second reverse switch M9 and the second forward switch M8. The second reverse switch M9 is connected in series between the reference voltage and the first reverse switch M6. The second forward switch M8 is connected between the output terminal 01 and the grounding terminal GND.

Referring to FIG. 2 again, when the second bias voltage input terminal AVB 1 is at a low potential Lo and the first voltage input terminal AVB is at a high potential Hi, the second reverse switch M9 is on, and the second forward switch M8 is off, and therefore the operation amplifier functions normally. When the second bias voltage input terminal AVB1 is at high potential Hi and the first bias voltage input terminal AVB is at low potential Lo, the second reverse switch M9 is off, and the second forward switch M8 is on, and therefore the operation amplifier does not work. At this stage, the reverse output buffer 20 consumes no electric current (because the second reverse switch M9 is off, and the output terminal 01 provides a stable low voltage output (because the second forward switch M8 is on).

As indicated above, the added second forward switch M8, second reverse switch M9 and second bias voltage input terminal AVB1 enable the reverse output buffer 20 to consume no electric current and the output terminal 01 to provide a stable low voltage output when the operation amplifier is not working.

While only embodiment of the present invention has been shown and described, it will be understood that various modifications and changes could be made thereunto without departing from the spirit and scope of the invention disclosed.

What the invention claimed is:

1. An operational amplifier comprising a differential amplifier circuit, a reverse output buffer, a non-inverting terminal, an inverting terminal, a first bias voltage input terminal, and an output terminal, said differential amplifier comprising a plurality of semiconductor switches and being connected to said non-inverting terminal, said inverting terminal and said first bias voltage input terminal;

said reverse output buffer comprising a first reverse switch and a first forward switch connected in series between a reference voltage and a grounding terminal, said output terminal being connected between said first reverse switch and said first forward switch, said first bias voltage input terminal being controlled to provide a bias voltage to said differential amplifier and said reverse output buffer to electrically connect said connect said first forward switch of said reverse output buffer;

said reverse output buffer further comprising a second reverse switch connected in series between said reference voltage and said first reverse switch, and a second forward switch connected between said output terminal and said grounding terminal, said second reverse switch and said second forward switch being electrically connected by a bias voltage provided from a second bias voltage input terminal connected thereto so that when said second bias voltage input terminal is at low potential and said first bias voltage input terminal is at high potential, said second reverse switch is on, and said second forward switch is off, said operational amplifier will function;

and when said second bias voltage input terminal is at high potential and said first bias voltage input terminal is at low potential, said second reverse switch is off, and said second forward switch is on, said operational amplifier will not work and will consume no electric current, and said output terminal providing a low potential output.

\* \* \* \* \*